United States Patent
Uscumlic et al.

(10) Patent No.: US 11,675,947 B2
(45) Date of Patent: Jun. 13, 2023

(54) MULTIDIMENSIONAL FPGA VIRTUALIZATION

(71) Applicant: Nokia Solutions and Networks Oy, Espoo (FI)

(72) Inventors: Bogdan Uscumlic, Les Ulis (FR); Yu-Chia Tseng, Massy (FR); Gopalasingham Aravinthan, Nozay (FR)

(73) Assignee: Nokia Solutions and Networks Oy, Espoo (FI)

( * ) Notice: Subject to any disclaimer, the term of this patent is extended or adjusted under 35 U.S.C. 154(b) by 137 days.

(21) Appl. No.: 17/240,052

(22) Filed: Apr. 26, 2021

(65) Prior Publication Data

US 2022/0343046 A1  Oct. 27, 2022

(51) Int. Cl.
| | | |
|---|---|---|
| *G06F 30/343* | (2020.01) | |
| *G06F 30/347* | (2020.01) | |
| *G06F 30/392* | (2020.01) | |
| *G06F 30/34* | (2020.01) | |

(52) U.S. Cl.
CPC ............ *G06F 30/343* (2020.01); *G06F 30/34* (2020.01); *G06F 30/347* (2020.01); *G06F 30/392* (2020.01)

(58) Field of Classification Search
CPC .... G06F 30/343; G06F 30/347; G06F 30/392; G06F 30/34
USPC ....... 716/117, 121, 128; 703/15; 714/33, 36, 714/725
See application file for complete search history.

(56) References Cited

U.S. PATENT DOCUMENTS

| | | | | |
|---|---|---|---|---|
| 5,590,305 | A * | 12/1996 | Terrill ................... | G06F 15/177 711/170 |
| 5,654,650 | A * | 8/1997 | Gissel ................. | H03K 19/1736 326/38 |
| 6,308,311 | B1 * | 10/2001 | Carmichael ............. | G06F 30/34 716/117 |
| 6,714,041 | B1 * | 3/2004 | Darling ............... | G06F 15/7867 711/170 |
| 7,020,764 | B2 * | 3/2006 | Kubota ............... | G06F 15/7867 326/38 |
| 7,180,776 | B1 * | 2/2007 | Wennekamp ............ | G11C 7/24 326/38 |
| 2009/0066365 | A1 * | 3/2009 | Solomon ................. | G06F 30/34 326/39 |
| 2019/0103873 | A1 * | 4/2019 | Sechen ............ | H03K 19/17744 |
| 2021/0083673 | A1 * | 3/2021 | Sechen .............. | H03K 19/1776 |

OTHER PUBLICATIONS

A. M. Caulfield et al., "A cloud-scale acceleration architecture," 2016 49th Annual IEEE/ACM International Symposium on Microarchitecture (MICRO), Taipei, 2016, pp. 1-13.
P4 Language Consortium viewed on Feb. 25, 2021, [retrieved from internet <https://p4.org/>].

\* cited by examiner

*Primary Examiner* — Phallaka Kik
(74) *Attorney, Agent, or Firm* — Harness, Dickey & Pierce, P.L.C.

(57) ABSTRACT

A network device includes processing circuitry configured to: determine whether to initiate a temporal reconfiguration or a spatial reconfiguration of a partial reconfiguration slot on a programmable device, and initiate the temporal reconfiguration or the spatial reconfiguration of the partial reconfiguration slot in response to determining that the temporal reconfiguration or the spatial reconfiguration is to be initiated.

12 Claims, 4 Drawing Sheets

MULTIDIMENSIONAL FPGA VIRTUALIZATION

BACKGROUND

A field-programmable gate array (FPGA) is an integrated circuit designed to be configured or re-configured after manufacture. FPGAs contain an array of Configurable Logic Blocks (CLBs), and a hierarchy of reconfigurable interconnects that allow these blocks to be wired together, like many logic gates that can be inter-wired in different configurations. CLBs may be configured to perform complex combinational functions, or simple logic gates like AND and XOR. CLBs also include storage medium blocks, which may be simple flip-flops or more complete blocks of memory, and specialized Digital Signal Processing blocks (DSPs) configured to execute some common operations (e.g., filters).

SUMMARY

The scope of protection sought for various example embodiments of the disclosure is set out by the independent claims. The example embodiments and/or features, if any, described in this specification that do not fall under the scope of the independent claims are to be interpreted as examples useful for understanding various embodiments.

One or more example embodiments provide reconfigurable hardware that may enable reduced latency in the performance and/or completion of tasks included in multi-tenant workloads.

At least one example embodiment provides a network device including processing circuitry configured to determine whether to initiate a temporal reconfiguration or a spatial reconfiguration of a partial reconfiguration slot on a programmable device, and initiate the temporal reconfiguration or the spatial reconfiguration of the partial reconfiguration slot in response to determining that the temporal reconfiguration or the spatial reconfiguration is to be initiated.

The partial reconfiguration slot may include a plurality of spatio-temporal slots configured to perform logical functions, and the temporal reconfiguration may include switching from a first of the plurality of spatio-temporal slots to a second of the plurality of spatio-temporal slots. The spatial reconfiguration may include a physical reprogramming of the partial reconfiguration slot or a spatio-temporal slot within the partial reconfiguration slot. The physical reprogramming may include loading a bitstream onto the partial reconfiguration slot or the spatio-temporal slot.

The network device may include the programmable device, wherein the programmable device includes a plurality of partial reconfiguration slots including the partial reconfiguration slot, and wherein the processing circuitry is configured to load balance traffic between the plurality of partial reconfiguration slots.

The programmable device may include a plurality of spatio-temporal slots nested in the partial reconfiguration slot.

The programmable device may be a field-programmable gate array (FPGA).

At least one example embodiment, provides a programmable device including at least one partial reconfiguration slot; and a plurality of spatio-temporal slots nested in the at least one partial reconfiguration slot.

The programmable device may include an interface configured to switch a function of the at least one partial reconfiguration slot by switching between the plurality of spatio-temporal slots. A duration of a spatial reconfiguration of the at least one partial reconfiguration slot may be greater than a duration of the switching between the plurality of spatio-temporal slots.

The plurality of spatio-temporal slots may be configured to perform functions associated with multiple different tenants.

The programmable device may include processing circuitry configured to perform partial reconfiguration of the at least one partial reconfiguration slot in response to a received request to perform a network task. The processing circuitry may be configured to perform the partial reconfiguration by determining whether to perform a temporal reconfiguration or a spatial reconfiguration of the at least one partial reconfiguration slot, and performing the temporal reconfiguration or the spatial reconfiguration of the at least one partial reconfiguration slot in response to determining that the temporal reconfiguration or the spatial reconfiguration is to be performed.

The processing circuitry may be configured to perform the temporal reconfiguration by switching from a first of the plurality of spatio-temporal slots to a second of the plurality of spatio-temporal slots.

The programmable device may be a field-programmable gate array (FPGA).

At least one example embodiment provides a method including: determining whether to perform a temporal reconfiguration or a spatial reconfiguration of a partial reconfiguration slot on a programmable device; and performing the temporal reconfiguration or the spatial reconfiguration of the partial reconfiguration slot in response to determining that the temporal reconfiguration or the spatial reconfiguration is to be initiated.

The partial reconfiguration slot may include a plurality of spatio-temporal slots configured to perform logical functions, and the performing the temporal reconfiguration may include switching from a first of the plurality of spatio-temporal slots to a second of the plurality of spatio-temporal slots.

The performing the spatial reconfiguration may include physically reprogramming the partial reconfiguration slot or a spatio-temporal slot within the partial reconfiguration slot. The physically reprogramming may include loading a bitstream onto the partial reconfiguration slot or the spatio-temporal slot.

The programmable device may include a plurality of partial reconfiguration slots including the partial reconfiguration slot, and the method may further include load balancing traffic between the plurality of partial reconfiguration slots.

At least one example embodiment provides a programmable device include means for determining whether to initiate a temporal reconfiguration or a spatial reconfiguration of a partial reconfiguration slot on a programmable device, and means for initiating the temporal reconfiguration or the spatial reconfiguration of the partial reconfiguration slot in response to determining that the temporal reconfiguration or the spatial reconfiguration is to be initiated.

At least one example embodiment provides a non-transitory computer-readable storage medium storing computer-readable instructions that, when executed, cause processing circuitry to perform a method of determining whether to perform a temporal reconfiguration or a spatial reconfiguration of at least one partial reconfiguration slot, and performing the temporal reconfiguration or the spatial reconfiguration of the at least one partial reconfiguration slot in response to determining that the temporal reconfiguration or the spatial reconfiguration is to be performed.

BRIEF DESCRIPTION OF THE DRAWINGS

Example embodiments will become more fully understood from the detailed description given herein below and the accompanying drawings, wherein like elements are represented by like reference numerals, which are given by way of illustration only and thus are not limiting of this disclosure.

Figure 1:
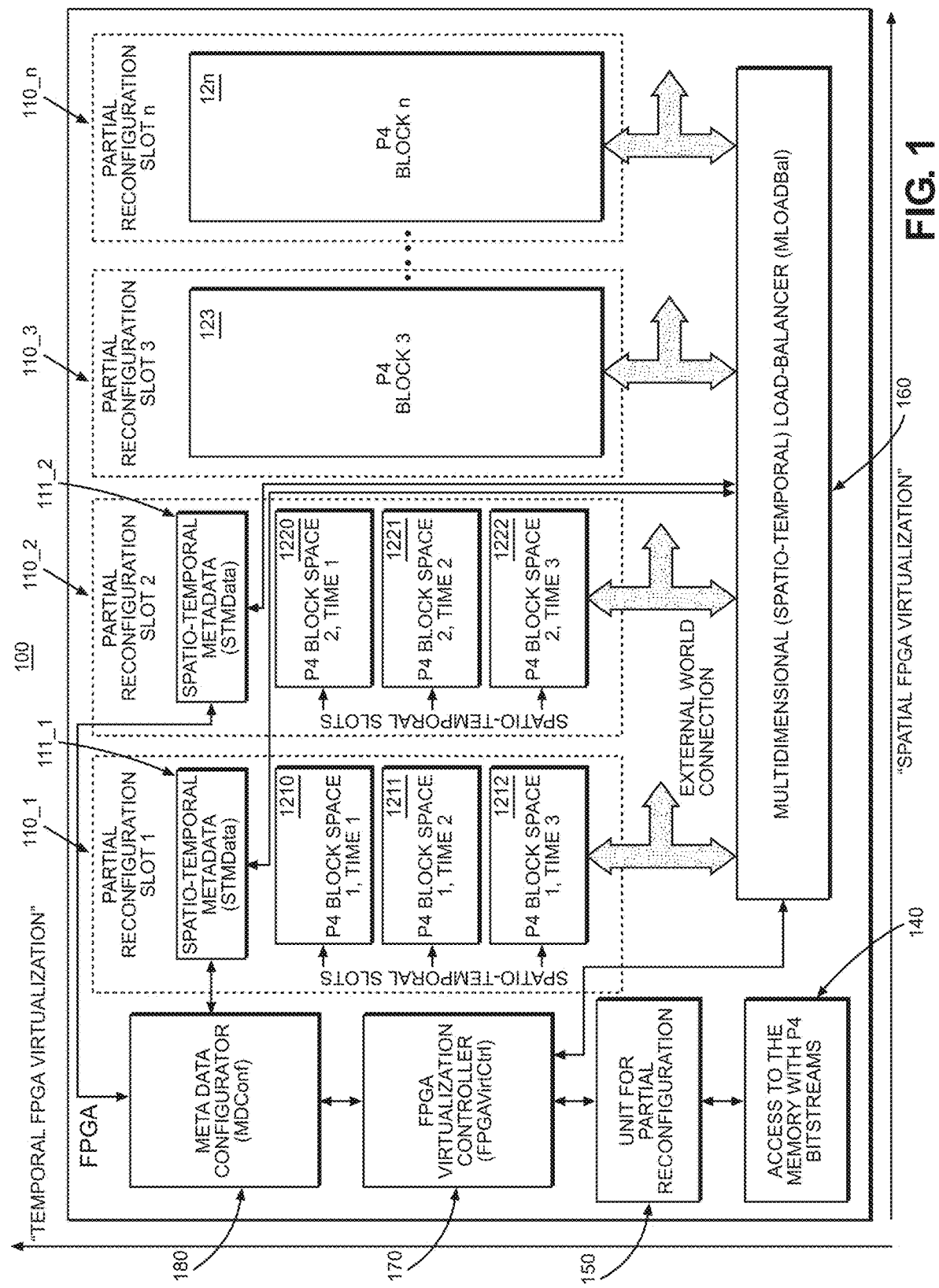
FIG. 1 is a block diagram illustrating a field-programmable gate array (FPGA) architecture according to some example embodiments.

It should be noted that these figures are intended to illustrate the general characteristics of methods, structure, and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. The use of similar or identical reference numbers in the various drawings is intended to indicate the presence of a similar or identical element or feature.

DETAILED DESCRIPTION

Various example embodiments will now be described more fully with reference to the accompanying drawings in which some example embodiments are shown.

Detailed illustrative embodiments are disclosed herein. However, specific structural and functional details disclosed herein are merely representative for purposes of describing example embodiments. The example embodiments may, however, be embodied in many alternate forms and should not be construed as limited to only the embodiments set forth herein.

Accordingly, while example embodiments are capable of various modifications and alternative forms, the embodiments are shown by way of example in the drawings and will be described herein in detail. It should be understood, however, that there is no intent to limit example embodiments to the particular forms disclosed. On the contrary, example embodiments are to cover all modifications, equivalents, and alternatives falling within the scope of this disclosure. Like numbers refer to like elements throughout the description of the figures.

In modern cloud-based data centers, servers are often equipped with reconfigurable hardware (e.g., field-programmable gate arrays (FPGAs)), which may be used to accelerate the computation of data-intensive and/or used in time-sensitive applications. The reconfigurable hardware may be interconnected in a free topology (e.g., a connected bidirectional graph of any type). In a case where the reconfigurable hardware includes FPGAs, the interconnected FPGAs may be referred to as a network of FPGAs.

FPGA reconfigurability is referred to as "partial reconfiguration," (PR) which supposes that parts of FPGA hardware may be reconfigured while the FPGA is running (in operation). Partial reconfiguration is performed on allocated portions of a FPGA chip (or FPGA reconfigurable logic), which are known as "partial reconfiguration slots."

A partial reconfiguration slot (PR slot) is a partially reconfigurable zone of a FPGA chip, with size and input/output signals that are defined when developing the FPGA design. The partial reconfiguration zone of the FPGA may be physically reconfigured while the remaining portions of the FPGA are running. Partial reconfiguration allows for multiple tenants in a data center to use/share a single FPGA.

Programming Protocol-independent Packet Processors (P4) is a novel data-plane programming language enabling data-plane programming during the exploitation lifetime of a device. P4 provides a novel paradigm, which differs from the approach used by traditional Application Specific Integrated Circuit (ASIC)-based devices (e.g., switches). Furthermore, P4 is target-independent in that the programming language may be applied to central processing units (CPUs), FPGAs, system-on-chips (SoCs), etc., and is protocol-independent in that the programming language supports all data-plane protocols and may be used to develop new protocols.

In one example, partial reconfiguration slots may be programmed/reprogrammed using P4 to perform network functions or services (e.g., routing, switching, application processing, etc.). Partial reconfiguration slots contain or utilize some FPGA resources allocated in a fixed way (e.g., transceivers (TRXs), Block Random Access Memories (BRAMs), look-up tables (LUTs), flip-flops (FFs), etc.) and a packet forwarding/processing function, which may be programmed by P4 language (referred to as a "P4 block").

P4 applications are composed of P4 modules that use different reconfigurable portions of FPGA's resources.

When implemented on FPGAs, P4 applications allow for reprogramming of only some portions of a FPGA (some or all of the partial reconfiguration slots), without stopping (or interrupting) operation of the device.

FPGAs with P4 modules in their partial reconfiguration slots may be interconnected in a web-scale cloud.

Although discussed herein with regard to P4 modules and workloads, example embodiments should not be limited to this example. Rather, example embodiments may be applicable to any kind of workload.

As a result of FPGA reconfigurability, each FPGA accelerator in a web-scale cloud may be configured to contain n partial reconfiguration slots. As mentioned above, these partial reconfiguration slots may be dynamically reconfigured during operation of the FPGA.

One or more example embodiments provide reconfigurable hardware architectures and/or methods enabling programmable hardware reconfiguration (and/or installation of new programming modules) in multi-tenant programmable devices (e.g., FPGAs) with reduced latency and/or improved security. For example purposes, example embodiments will be described with regard to a FPGA architecture. However, example embodiments should not be limited thereto.

One or more example embodiments provide multidimensional programmable hardware (e.g., FPGA) virtualization through the addition of, for example, a temporal virtualization to the spatial virtualization. According to one or more example embodiments, temporal virtualization may include relatively fast reconfiguring of P4 blocks based on P4 metadata. The P4 metadata may be, for example, a customizable interface of the P4 block, which can be used to exchange data information with the P4 blocks during the operation of the multidimensional programmable hardware.

The above-discussed spatial and temporal virtualization may be provided through spatio-temporal (ST) slots within (or replacing) respective PR slots. A single PR slot may include one or more (e.g., a plurality of) ST slots. A ST slot is a logical function that is implemented in a PR slot of, for example, a FPGA. Each PR slot may contain/support multiple ST slots (multiple such logical functions). At a given time, a single active function of an active ST slot in the same PR slot (or zone) is possible. However, each of the ST slots in a PR slot may include (or be programmed according to) a different function (e.g., IP routing, switching, load balancing, etc.). ST slots may be shared between multiple tenants, and thus, ST slots in a PR slot may be configured to perform functions associated with multiple different tenants (or users).

ST slots may switch their function in space (spatial reconfiguration) in the order of milliseconds (ms) (e.g., using partial reconfiguration), and/or the function of a PR slot may be switched by selecting a particular ST slot in time (temporal reconfiguration) in only a few ns.

The switching of the function of PR slot in time may be enabled by properties of P4 blocks with different functions (1 function=1 ST slot), which allows for switching between functions by selecting a different ST slot from among the ST slots of a PR slot.

FIG. 1 is a block diagram illustrating a FPGA architecture according to some example embodiments.

Referring to FIG. 1, the FPGA 100 includes a plurality of partial reconfiguration slots 110_1 to 110_n, a unit for partial reconfiguration 150, a multidimensional load balancer (load balancer or MLoadBal) 160, a virtualization controller (FPGAVirtCtrl) 170, and a metadata configurator (MDConf) 180.

The PR slot 110_1 includes a plurality of nested ST slots 1210, 1211, and 1212 and a spatio-temporal metadata module (STMData) 111_1 to control the function (e.g., activation and deactivation) of the plurality of nested ST slots. Similarly, the PR slot 110_2 includes a plurality of nested ST slots 1220, 1221, and 1222 and a STMData 111_2 to control the function of the plurality of nested ST slots. The STMData is an interface for access to the ST slots in each PR slot.

The partial reconfiguration slots 110_3, . . . , 110_n may include respective P4 blocks 123 through 12n. Though only PR slots 110_1 and 110_2 are illustrated as including ST slots, example embodiments should not be limited to this example. Rather, any of the PR slots 110_1 to 110_n may include ST slots. Moreover, ST slots may be created, deleted, added, or removed from a given PR slot as needed during operation.

Although the PR slots 110_1 and 110_2 are each illustrated as including three nested ST slots, example embodiments should not be so limited. Rather, each PR slot may include, for example, more than three ST slots or less than three ST slots. At a given time, a ST slot in a PR slot may be programmed (e.g., include a P4 block) to perform one of a plurality of functions. Although discussed with regard to ST slots being implemented as P4 blocks, example embodiments should not be limited to this example.

To change functionality the PR slots 110_1 and 110_2 may undergo spatial reconfiguration (e.g., a partial reconfiguration of an ST slot) or a temporal reconfiguration (e.g., a selection of a ST slot within the PR slot).

With regard to FIG. 1, for example, at a time $t_1$ the PR slot 110_1 may have function "P4 block space 1, time 1" (ST slot 1210) (e.g., IP routing), whereas at a subsequent time $t_2$, the same PR slot may have the function of "P4 block space 1, time 2" (ST slot 1211) (e.g., load balancing), etc.

The virtualization controller 170 may initiate and/or control the spatial and/or temporal reconfiguration of the FPGA 100 as needed. For example, the virtualization controller 170 may determine whether a partial reconfiguration (e.g., temporal or spatial reconfiguration) of the FPGA 100 is appropriate based on a task received from an external controller and/or network device (not illustrated). Example functionality of the virtualization controller 170 will be discussed in further detail below.

The unit for partial reconfiguration 150 may facilitate the spatial reconfiguration of the ST slots and/or PR slots. In the case of PR slots 110_1 and 110_2, the unit for partial reconfiguration 150 may facilitate spatial reconfiguration of one or more ST slots nested within the PR slot. With regard to the PR slots 110_3, . . . , 110_n, the unit for partial reconfiguration 150 may facilitate partial reconfiguration of the PR slot itself. For example, the unit for partial reconfiguration 150 may load a design (e.g., in an ST slot or a PR slot) based on data included in a P4 bitstream. The P4 bitstream may, for example, be received (or obtained) from an outside source (e.g., a library of bitstreams stored in a memory) via an access interface 140. In one example, the access interface 140 may include a bus (e.g., a universal serial bus (USB)) and/or a connection to an access link (e.g., a wireline, fiber optic, and/or wireless receiver) providing communication between the memory storing the library of bitstreams and the unit for partial reconfiguration 150. In another example embodiment, the unit for partial reconfiguration 150 may receive partial reconfiguration instructions via a Joint Test Action Group (JTAG) and/or, the partial reconfiguration instructions may be stored in an off-chip memory (not shown).

The metadata configurator (MDConf) 180 may facilitate temporal reconfiguration of PR slots including nested ST slots (e.g., PR slot 110_1 and/or 110_2 in FIG. 1). For example, the MDConf 180 may initiate switching between the ST slots 1210 to 1212 in PR slot 110_1 and/or between ST slots 1220 to 1222 in a PR slot 110_2 by sending a control signal to the STMData 111_1 and/or 111_2 in the respective PR slot. The control signal may include, for example, instructions regarding the switching between the ST slots and/or a signal to coordinate the switching between ST slots with other functions of the FPGA 100.

The operation of the MDConf 180 may be updated based on the configuration of the FPGA 100. For example, when a function of a PR slot is changed (e.g., through a spatial and/or temporal reconfiguration), the MDConf 180 may update its operating mode based on the changes to the FPGA 100. Example functionality of the MDConf 180 will be discussed in more detail later.

The load balancer 160 may steer (e.g., load balance) traffic to and from the PR slots 110_1 to 110_n based on a current configuration of the FPGA 100. For example, the load balancer 160 may steer a task to a PR slot configured to perform a function related to the task. In the case wherein a PR slot is not configured to perform a function related to the task at the time the task is received, the load balancer 160 may delay (or buffer) traffic for the task until the task matches a function of a PR slot 110_1 to 110_n. For example, the load balancer 160 may delay a task until after spatial and/or temporal reconfiguration of a PR slot 110_1 to 110_n to include a function related to the received task is completed. The load balancer 160 may be considered a multidimensional load balancer (MLoadBal).

The operation of the load balancer 160 may be updated based on the configuration of the FPGA 100. For example, when a function of a PR slot is changed (e.g., through a spatial and/or temporal reconfiguration) the load balancer 160 may update its operating mode based on the changes to the FPGA 100. Example functionality of the load balancer 160 will be discussed in more detail later.

In some example embodiments, the operations of the load balancer 160 and the MDConf 180 may be synchronized. For example, the current state of the PR slot may be detected by the load balancer 160 reading the state of signals from the PR slot 110_1 and/or 110_2 (e.g., from the respective STMData 111_1 or 111_2) and/or the MDConf 180 and the load balancer 160 may operate synchronously such that the MDConf 180 and the load balancer 160 may timely execute their operations in order to preserve proper processing of all data. For example, if the configuration of a ST and/or PR slot has changed, and the load balancer 160 needs to change its load balancing behavior, then the MDConf 180 and the load balancer 160 may be synchronized such that the setup of the load balancer 160 occurs first, in order for the load balancer 160 to be ready to properly process the newly incoming traffic from the newly configured ST and/or PR slot.

The virtualization controller 170, the MDConf 180, the unit for partial reconfiguration 150 and/or the load balancer 160 may be implemented on the FPGA 100 or off chip. In one example, if not implemented on the FPGA 100, these elements may be implemented by processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, another FPGA, a System-on-Chip (SoC), a programmable logic unit, a microprocessor, application-specific integrated circuit (ASIC), etc. Further, the virtualization controller 170, the MDConf 180, the unit for partial reconfiguration 150 and/or the load balancer 160 may be embodied as individual components, or may be included in a combined component including the virtualization controller 170, the MDConf 180, the unit for partial reconfiguration 150 and/or the load balancer 160.

Figure 2:
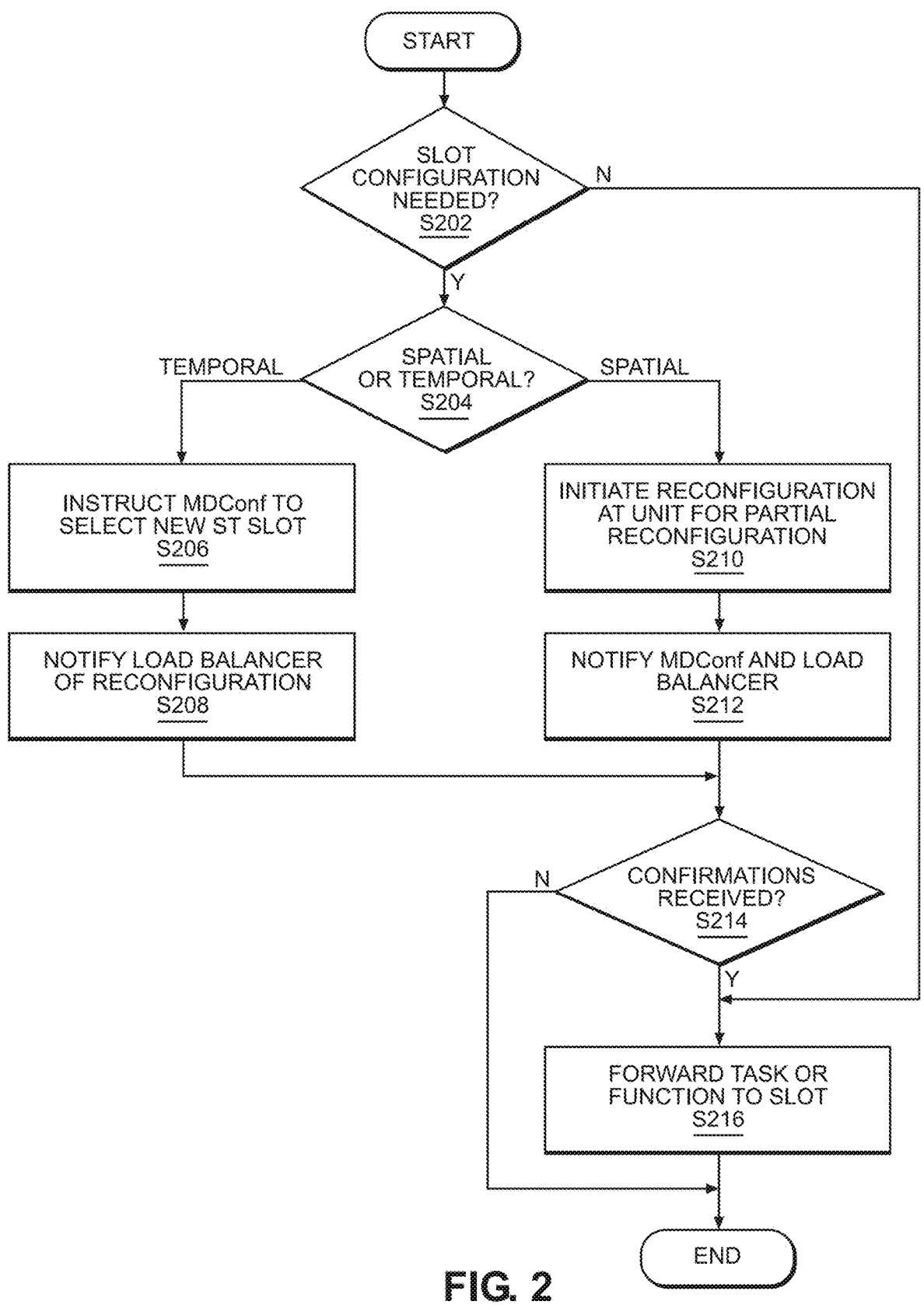
FIG. 2 is a flow chart illustrating a method according to some example embodiments.

FIG. 2 is a flow chart illustrating a method of operating the virtualization controller 170 according to some example embodiments. The example embodiment shown in FIG. 2 will be discussed with regard to PR slot 110_1 for example purposes. However, it should be understood that similar or the same methods may be applied to any PR slot including ST slots. Although illustrated for a single iteration of a task for clarity, the method shown in FIG. 2 may be performed iteratively for multiple tasks as needed.

Referring to FIG. 2, at step S202, in response to receiving a task from an external controller, such as a network orchestrator (not illustrated), the virtualization controller 170 determines whether reconfiguration of PR slot 110_1 is needed to execute the task or one or more functions of the task. In one example, whether reconfiguration of the PR slot 110_1 is needed may be indicated by the external controller (e.g., via control or other appropriate signaling).

If reconfiguration of the PR slot 110_1 is not needed, then at step S216 the virtualization controller 170 forwards the task (or function thereof) to the PR slot 110_1 for execution by an appropriate ST slot configured to perform the task (or function thereof). In this case, the PR slot 110_1 is not reconfigured. The process then terminates for this task.

Returning to step S202, if reconfiguration of the PR slot 110_1 is needed, then at step S204 the virtualization controller 170 determines whether spatial or temporal reconfiguration of the PR slot 110_1 is required. The virtualization controller 170 may determine whether spatial or temporal reconfiguration is necessary based on a complexity of the functions associated with the task (and/or the FPGA resource needs of the task) and on the availability and type of ST slots that are already supported by PR slot 110_1. For example, if the functions of the ST slot associated with a task are too complex (e.g., require a lot of FPGA resources), and cannot be combined in a single PR slot (because of the amount of the required FPGA logic), then spatial reconfiguration may be necessary. In another example, if an ST slot in a PR slot is not configured to execute the requested function, or the number of ST slots in the PR slot should be increased or decreased, then spatial reconfiguration may be necessary.

If spatial reconfiguration is needed, then at step S210 the virtualization controller 170 initiates spatial reconfiguration of the PR slot 110_1 by the unit for partial reconfiguration 150. For example, the virtualization controller 170 may send instructions to the unit for partial reconfiguration 150 to perform spatial reconfiguration of one or more ST slots 1210, 1211, or 1212 in the PR slot 110_1. Alternatively, or in combination with the spatial reconfiguration of one or more ST slots, the virtualization controller 170 may send instructions to the unit for partial reconfiguration 150 to add or remove ST slots within the PR slot. In response to instructions from the virtualization controller 170, the unit for partial reconfiguration 150 reconfigures the PR slot 110_1 by loading a bitstream (e.g., a P4 bitstream or other designs) with the update of one or more of the ST slots 1210, 1211 or 1212 to configure the PR slot and/or the corresponding ST slot(s) to execute the task or function(s) thereof. Once having completed spatial reconfiguration of the PR slot 110_1, the unit for partial reconfiguration 150 outputs a confirmation signal indicating the same to the virtualization controller 170.

At step S212, the virtualization controller 170 notifies the MDConf 180 and the load balancer 160 of the initiated spatial reconfiguration of the PR slot 110_1.

In one example, the notification from the virtualization controller 170 to the MDConf 180 may instruct the MDConf 180 to update parameters related to the PR slot 110_1. For example, the parameters related to a PR slot may include the number of ST slots nested in the PR slot, the functionality of the plurality of ST slots, the configuration of the PR slot, and/or the like. The parameters may be stored in a local memory of the FPGA chip (e.g., BRAM) and/or on an external memory.

Once the parameters have been updated, the MDConf 180 sends a confirmation signal back to the virtualization controller 170 indicating that the parameters for the PR slot 110_1 have been updated.

The notification from the virtualization controller 170 to the load balancer 160 may include instructions to update the configuration of the load balancer 160 based on the new configuration of the FPGA 100 affected by the spatial reconfiguration of the PR slot 110_1. For example, the virtualization controller 170 may send instructions to the load balancer 160 to update the parameters related to the function of the PR slot 110_1 and/or the type of traffic and in what proportion the traffic should be load-balanced between the PR slots 110_1 to 110_n and/or the external devices. For example, the instructions may define the load balancing function (e.g., define which traffic flows from which P4 blocks and in which proportion to load balance between which output transceivers/interfaces). The load balancing parameters may be used by the load balancer 160 to operate after the spatial reconfiguration is finalized. Furthermore, like in the case of MDConf 180, the updated parameters may also contain the parameters related to a PR slot, and may, for example, include the number of ST slots nested in the PR slot, the functionality of the plurality of ST slots, the configuration of the PR slot, and/or the like. Once the configuration of the load balancer 160 is updated, the load balancer 160 sends a confirmation signal back to the virtualization controller 170 indicating completion of the update.

At step S214, the virtualization controller 170 determines whether confirmation signals have been received from each of the unit for partial reconfiguration 150, the MDConf 180, and the load balancer 160.

If confirmation signals have not been received from each of the elements noted above, then the virtualization controller 170 determines that the spatial reconfiguration has not completed and the process terminates. In this case, the process may be repeated as needed.

Returning to step S214, if the confirmation signals have been received, then at step S216 the virtualization controller 170 forwards the task or function to the PR slot 110_1 for execution.

Returning to step S204, if the virtualization controller 170 determines that temporal reconfiguration of the PR slot 110_1 is needed, then at step S206 the virtualization controller 170 sends instructions to the MDConf 180 to initiate a temporal reconfiguration of a PR slot 110_1 and updating of the STMData 131. The instructions may include, for example, information about (e.g., an identifier of) the ST slot to be activated (selected) to reconfigure the PR slot 110_1 to perform the function of the designated slot. Example operation of the MDConf 180 will be discussed in more detail later with regard to FIG. 3.

At step S208, the virtualization controller 170 notifies the load balancer 160 to update the configuration of the load balancer 160 based on the new configuration of the FPGA 100 affected by the temporal reconfiguration of the PR slot 110_1. As with step S212 discussed above, the instructions from the virtualization controller 170 may include instructions for the load balancer 160 to update the parameters related to what type of traffic and in what proportion the traffic should be load-balanced between the PR slots 110_1 to 110_*n* and/or external devices based on the reconfiguration. The instructions may also include, for example, information about (and identifier of) the activated (selected) ST slot.

The process then proceeds to step S214 at which the virtualization controller 170 determines whether confirmation signals have been received from the MDConf 180 and the load balancer 160. In the case of temporal reconfiguration, confirmation from the unit for partial reconfiguration 150 is not necessary.

As noted above, if confirmation signals have not been received, then the virtualization controller 170 determines that the temporal reconfiguration is not complete and the process terminates. In this case, the process may be repeated as needed. Otherwise, if the confirmation signals have been received, then the process proceeds to step S216 and continues as discussed above.

Although not shown explicitly in FIG. 2, in some instances, both spatial and temporal reconfiguration may be required and/or utilized. For example, spatial and temporal reconfiguration may be used when changes to functionality at a PR slot is required, and the novel function is composed of several logical functions (several ST slots). In this case, the method shown in FIG. 2 may be performed iteratively with the spatial reconfiguration occurring prior to the temporal reconfiguration to configure one or more PR slots to perform a task or one or more functions thereof.

Figure 3:
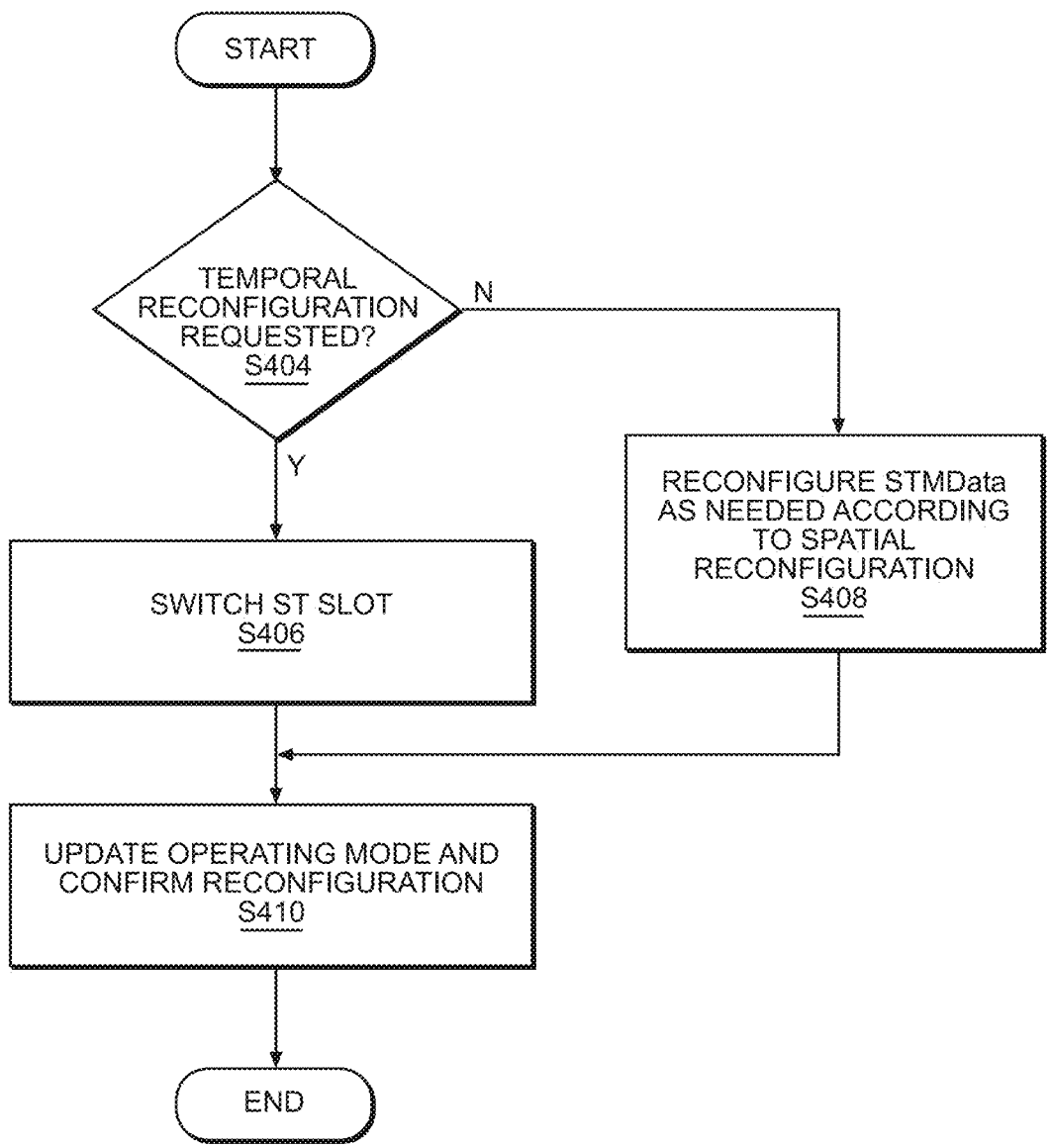
FIG. 3 is a flow chart illustrating another method according to some example embodiments.

FIG. 3 is a flow chart illustrating a method of operation of the MDConf 180 according to some example embodiments. As with FIG. 2, the method shown in FIG. 3 will be described with regard to reconfiguration of PR slot 110_1 for example purposes. However, example embodiments should not be limited to this example.

Referring to FIG. 3, in response to receiving a notification (e.g., a control signal) from the virtualization controller 170, at step S404 the MDConf 180 determines whether temporal reconfiguration of PR slot 110_1 has been requested. For example, the MDConf 180 may check whether the notification from the virtualization controller 170 includes instructions for temporal reconfiguration of the PR slot 110_1.

If temporal reconfiguration is requested, then at step S406 the MDConf 180 performs temporal reconfiguration of the PR slot 110_1. In one example, the MDConf 180 sends a control signal to the STMData 131 to switch the temporal functions of the PR slot 110_1 by selecting an appropriate ST slot from among the ST slots 1210, 1211, and 1212 to activate based on the requested task or function thereof. As mentioned above, the STMData 131 is an interface between the MDConf 180 and the ST slots at a PR slot, wherein the STMData 131 affects switching between ST slots at the PR slot.

At step S408, the MDConf 180 updates its operating mode based on the updated configuration (e.g., temporal reconfiguration of the PR slot 110_1). For example, the MDConf 180 may update its operating mode based on the functions programmed into the FGPA 100 by the temporal reconfiguration. The MDConf 180 then sends a confirmation signal back to the virtualization controller 170 indicating that operations at the MDConf 180 are complete.

Returning to step S404, if temporal reconfiguration has not been requested by the virtualization controller 170, then at step S408 the MDConf 180 reconfigures the STMData 131 as needed based on the spatial reconfiguration initiated at the unit for partial reconfiguration 150. In this case, the MDConf 180 may receive the information regarding the spatial reconfiguration from the virtualization controller 170 in the notification. The MDConf 180 then accordingly reconfigures the STMData 131, to activate a new ST slot in the newly spatially reconfigured P4 block. For example, after the reconfiguration by the MDConf 180, the STMData 131 points to the selection (and/or provides the instructions for the configuration) of the newly activated ST slot. The process then proceeds to step S408 and continues as discussed above.

Figure 4:
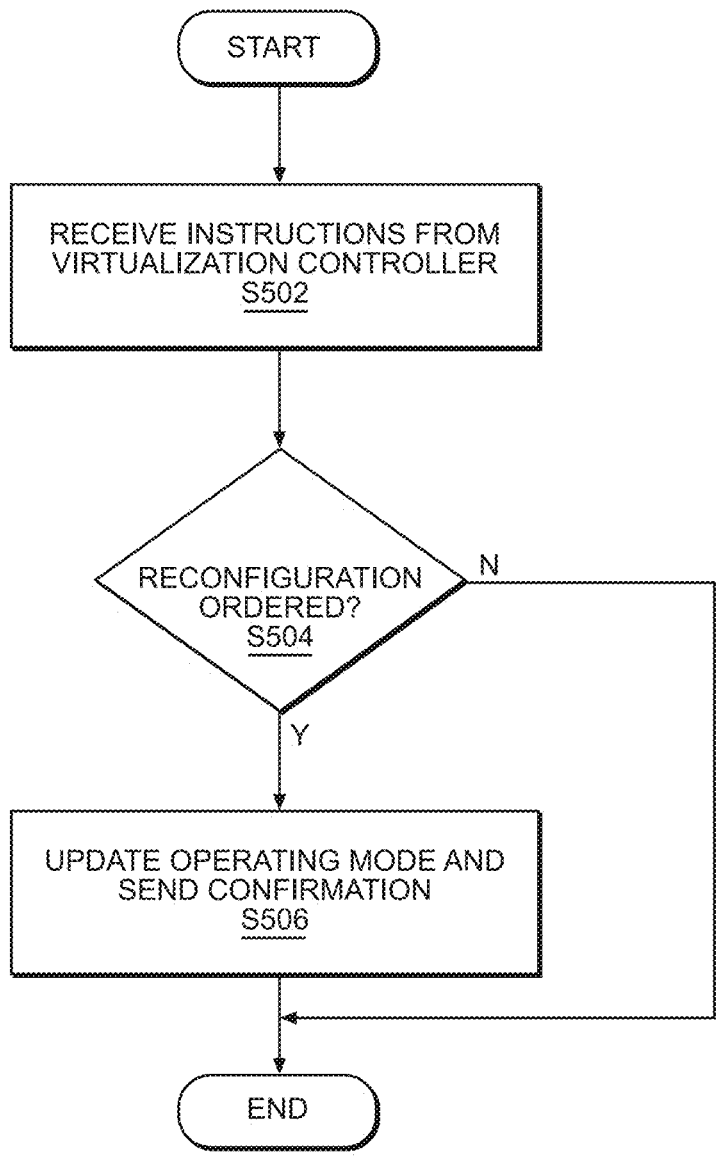
FIG. 4 is a flow chart illustrating yet another method according to some example embodiments.

FIG. 4 is a flow chart illustrating a method of operating the load balancer 160 according to some example embodiments. As with FIG. 2, the method shown in FIG. 4 will be described with regard to reconfiguration of PR slot 110_1 for example purposes. However, example embodiments should not be limited this example.

Referring to FIG. 4, while the load balancer 160 is steering (e.g., load balancing) traffic to and from the FPGA 100 based on the configuration of the FPGA 100, at step S502 the load balancer 160 receives a notification (e.g., instructions) from the virtualization controller 170.

In response to receiving the notification, at step S504 the load balancer 160 determines whether spatial or temporal reconfiguration of the PR slot 110_1 has been requested by the virtualization controller 170.

If the virtualization controller 170 has not requested spatial or temporal reconfiguration, then the load balancer 160 maintains its nominal operating mode and the process terminates.

Returning to step S504, if the virtualization controller 170 has requested spatial or temporal reconfiguration, then at step S506, the load balancer 160 updates its operating mode based on the updated configuration (reconfiguration) of the PR slot 110_1. For example, at step S506, the load balancer may first save (e.g., update) new configuration parameters for load balancing and/or P4/ST slot(s) properties at a local memory (e.g. on the BRAM of the FPGA chip) or on the external memory (e.g., a global RAM memory). Then, the load balancer 160 switches to the new configuration, as requested by the virtualization controller 170. The P4/ST slot properties may include, for example, the parameters discussed in step S212 of FIG. 2. The load balancer 160 then outputs a confirmation signal to the virtualization controller 170 indicating that the operation at the load balancer 160 is complete.

Although the terms first, second, etc. may be used herein to describe various elements, these elements should not be limited by these terms. These terms are only used to distinguish one element from another. For example, a first element could be termed a second element, and similarly, a second element could be termed a first element, without departing from the scope of this disclosure. As used herein, the term "and/or," includes any and all combinations of one or more of the associated listed items.

When an element is referred to as being "connected," or "coupled," to another element, it can be directly connected or coupled to the other element or intervening elements may be present. By contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Specific details are provided in the following description to provide a thorough understanding of example embodiments. However, it will be understood by one of ordinary skill in the art that example embodiments may be practiced without these specific details. For example, systems may be shown in block diagrams so as not to obscure the example embodiments in unnecessary detail. In other instances, well-known processes, structures, and techniques may be shown without unnecessary detail in order to avoid obscuring example embodiments.

As discussed herein, illustrative embodiments will be described with reference to acts and symbolic representations of operations (e.g., in the form of flow charts, flow diagrams, data flow diagrams, structure diagrams, block diagrams, etc.) that may be implemented as program modules or functional processes include routines, programs, objects, components, data structures, etc., that perform particular tasks or implement particular abstract data types and may be implemented using existing hardware at, for example, existing network apparatuses, elements or entities including cloud-based data centers, computers, cloud-based servers, or the like. Such existing hardware may be processing or control circuitry such as, but not limited to, one or more processors, one or more Central Processing Units (CPUs), one or more controllers, one or more arithmetic logic units (ALUs), one or more digital signal processors (DSPs), one or more microcomputers, one or more field programmable gate arrays (FPGAs), one or more System-on-Chips (SoCs), one or more programmable logic units (PLUs), one or more microprocessors, one or more Application Specific Integrated Circuits (ASICs), or any other device or devices capable of responding to and executing instructions in a defined manner.

Although a flow chart may describe the operations as a sequential process, many of the operations may be performed in parallel, concurrently or simultaneously. In addition, the order of the operations may be re-arranged. A process may be terminated when its operations are completed, but may also have additional steps not included in the figure. A process may correspond to a method, function, procedure, subroutine, subprogram, etc. When a process corresponds to a function, its termination may correspond to a return of the function to the calling function or the main function.

As disclosed herein, the term "storage medium," "computer readable storage medium" or "non-transitory computer readable storage medium" may represent one or more devices for storing data, including read only memory (ROM), random access memory (RAM), magnetic RAM, core memory, magnetic disk storage mediums, optical storage mediums, flash memory devices and/or other tangible machine-readable mediums for storing information. The term "computer-readable medium" may include, but is not limited to, portable or fixed storage devices, optical storage devices, and various other mediums capable of storing, containing or carrying instruction(s) and/or data.

Furthermore, example embodiments may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a computer readable storage medium. When implemented in software, a processor or processors will perform the necessary tasks. For example, as mentioned above, according to one or more example embodiments, at least one memory may include or store computer program code, and the at least one memory and the computer program code may be configured to, with at least one processor, cause a network apparatus, network element or network device to perform the necessary tasks. Additionally, the processor, memory and example algorithms, encoded as computer program code, serve as means for providing or causing performance of operations discussed herein.

A code segment of computer program code may represent a procedure, function, subprogram, program, routine, subroutine, module, software package, class, or any combination of instructions, data structures or program statements. A code segment may be coupled to another code segment or a hardware circuit by passing and/or receiving information, data, arguments, parameters or memory contents. Information, arguments, parameters, data, etc. may be passed, forwarded, or transmitted via any suitable technique including memory sharing, message passing, token passing, network transmission, etc.

The terms "including" and/or "having," as used herein, are defined as comprising (i.e., open language). The term "coupled," as used herein, is defined as connected, although not necessarily directly, and not necessarily mechanically. Terminology derived from the word "indicating" (e.g., "indicates" and "indication") is intended to encompass all the various techniques available for communicating or referencing the object/information being indicated. Some, but not all, examples of techniques available for communicating or referencing the object/information being indicated include the conveyance of the object/information being indicated, the conveyance of an identifier of the object/information being indicated, the conveyance of information used to generate the object/information being indicated, the conveyance of some part or portion of the object/information being indicated, the conveyance of some derivation of the object/information being indicated, and the conveyance of some symbol representing the object/information being indicated.

According to example embodiments, network apparatuses, elements or entities including cloud-based data centers, computers, cloud-based servers, or the like, may be (or include) hardware, firmware, hardware executing software or any combination thereof. Such hardware may include processing or control circuitry such as, but not limited to, one or more processors, one or more CPUs, one or more controllers, one or more ALUs, one or more DSPs, one or more microcomputers, one or more FPGAs, one or more SoCs, one or more PLUs, one or more microprocessors, one or more ASICs, or any other device or devices capable of responding to and executing instructions in a defined manner.

Benefits, other advantages, and solutions to problems have been described above with regard to specific embodiments of the invention. However, the benefits, advantages, solutions to problems, and any element(s) that may cause or result in such benefits, advantages, or solutions, or cause such benefits, advantages, or solutions to become more pronounced are not to be construed as a critical, required, or essential feature or element of any or all the claims.

Reference is made in detail to embodiments, examples of which are illustrated in the accompanying drawings, wherein like reference numerals refer to the like elements throughout. In this regard, the example embodiments may have different forms and should not be construed as being limited to the descriptions set forth herein. Accordingly, the example embodiments are merely described below, by referring to the figures, to explain example embodiments of the present description. Aspects of various embodiments are specified in the claims.

What is claimed is:

1. A network device comprising:
   processing circuitry configured to
      determine whether to initiate a temporal reconfiguration or a spatial reconfiguration of a partial reconfiguration slot on a programmable device, and
      initiate the temporal reconfiguration or the spatial reconfiguration of the partial reconfiguration slot in response to determining that the temporal reconfiguration or the spatial reconfiguration is to be initiated.

2. The network device of claim 1, wherein
   the partial reconfiguration slot includes a plurality of spatio-temporal slots configured to perform logical functions, and
   the temporal reconfiguration includes switching from a first of the plurality of spatio-temporal slots to a second of the plurality of spatio-temporal slots.

3. The network device of claim 1, wherein the spatial reconfiguration includes a physical reprogramming of the partial reconfiguration slot or a spatio-temporal slot within the partial reconfiguration slot.

4. The network device of claim 3, wherein the physical reprogramming includes loading a bitstream onto the partial reconfiguration slot or the spatio-temporal slot.

5. The network device of claim 1, further comprising:
   the programmable device, wherein the programmable device includes a plurality of partial reconfiguration slots including the partial reconfiguration slot, and wherein
   the processing circuitry is configured to load balance traffic between the plurality of partial reconfiguration slots.

6. The network device of claim 1, further comprising:
   the programmable device, wherein the programmable device includes a plurality of spatio-temporal slots nested in the partial reconfiguration slot.

7. The network device of claim 1, wherein the programmable device is a field-programmable gate array (FPGA).

8. A method comprising:
   determining whether to perform a temporal reconfiguration or a spatial reconfiguration of a partial reconfiguration slot on a programmable device; and
   performing the temporal reconfiguration or the spatial reconfiguration of the partial reconfiguration slot in response to determining that the temporal reconfiguration or the spatial reconfiguration is to be initiated.

9. The method of claim 8, wherein
   the partial reconfiguration slot includes a plurality of spatio-temporal slots configured to perform logical functions, and
   the performing the temporal reconfiguration includes switching from a first of the plurality of spatio-temporal slots to a second of the plurality of spatio-temporal slots.

10. The method of claim 8, wherein the performing the spatial reconfiguration includes physically reprogramming the partial reconfiguration slot or a spatio-temporal slot within the partial reconfiguration slot.

11. The method of claim 10, wherein the physically reprogramming includes loading a bitstream onto the partial reconfiguration slot or the spatio-temporal slot.

12. The method of claim 8, wherein
   the programmable device includes a plurality of partial reconfiguration slots including the partial reconfiguration slot, and
   the method further includes load balancing traffic between the plurality of partial reconfiguration slots.

* * * * *